US011823767B2

(12) United States Patent
Pohlmann

(10) Patent No.: US 11,823,767 B2
(45) Date of Patent: Nov. 21, 2023

(54) DYNAMIC RANDOM ACCESS MEMORY SPEED BIN COMPATIBILITY

(71) Applicant: Micron Technology, Inc., Boise, ID (US)

(72) Inventor: Erik V. Pohlmann, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 17/704,995

(22) Filed: Mar. 25, 2022

(65) Prior Publication Data

US 2022/0319561 A1 Oct. 6, 2022

Related U.S. Application Data

(60) Provisional application No. 63/169,774, filed on Apr. 1, 2021.

(51) Int. Cl.
*G11C 7/10* (2006.01)
*G11C 8/18* (2006.01)
(52) U.S. Cl.
CPC .......... *G11C 7/1093* (2013.01); *G11C 7/1063* (2013.01); *G11C 7/1066* (2013.01); *G11C 8/18* (2013.01)
(58) Field of Classification Search
CPC ........................................................ G11C 7/10
USPC ...................................................... 365/233.1
See application file for complete search history.

(56) References Cited

U.S. PATENT DOCUMENTS

| 2007/0070788 | A1* | 3/2007 | Tamlyn ..................... G11C 7/08 365/233.1 |
| 2014/0192583 | A1 | 7/2014 | Rajan et al. |
| 2017/0177478 | A1 | 6/2017 | Qawami et al. |
| 2018/0211699 | A1 | 7/2018 | Gopalan et al. |
| 2019/0266106 | A1* | 8/2019 | Murphy .............. G06F 12/0813 |
| 2022/0246188 | A1* | 8/2022 | Pohlmann .............. G11C 7/222 |

FOREIGN PATENT DOCUMENTS

| KR | 10-2000-0062099 A | 10/2000 |
| KR | 10-2012-0119441 A | 10/2012 |

OTHER PUBLICATIONS

"International Search Report and Written Opinion of the International Searching Authority," issued in connection with Int'l Appl. No. PCT/US2022/071391, dated Jul. 15, 2022 (13 pages).

\* cited by examiner

*Primary Examiner* — Muna A Techane
(74) *Attorney, Agent, or Firm* — Holland & Hart LLP

(57) ABSTRACT

Methods, systems, and devices for dynamic random access memory speed bin compatibility are described. For instance, a device (e.g., a memory device, a host device) may combine a first parameter with a second parameter to generate a third parameter, where the first parameter may be associated with a duration for a clock that is coupled with a memory array to perform a clock cycle and the second parameter may be associated with a timing constraint associated with initiating an access operation for the memory array. The device may determine a latency of a column address strobe based on the third parameter relative to (e.g., satisfying) a threshold value and may access one or more memory cells of the memory array based on the latency of the column address strobe.

32 Claims, 6 Drawing Sheets

DYNAMIC RANDOM ACCESS MEMORY SPEED BIN COMPATIBILITY

CROSS REFERENCE

The present application for patent claims the benefit of and priority to U.S. Provisional Patent Application No. 63/169,774 by Pohlmann, entitled "DYNAMIC RANDOM ACCESS MEMORY SPEED BIN COMPATIBILITY," filed Apr. 1, 2021, assigned to the assignee hereof, and expressly incorporated by reference in its entirety herein.

FIELD OF TECHNOLOGY

The following relates generally to one or more systems for memory and more specifically to dynamic random access memory speed bin compatibility.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
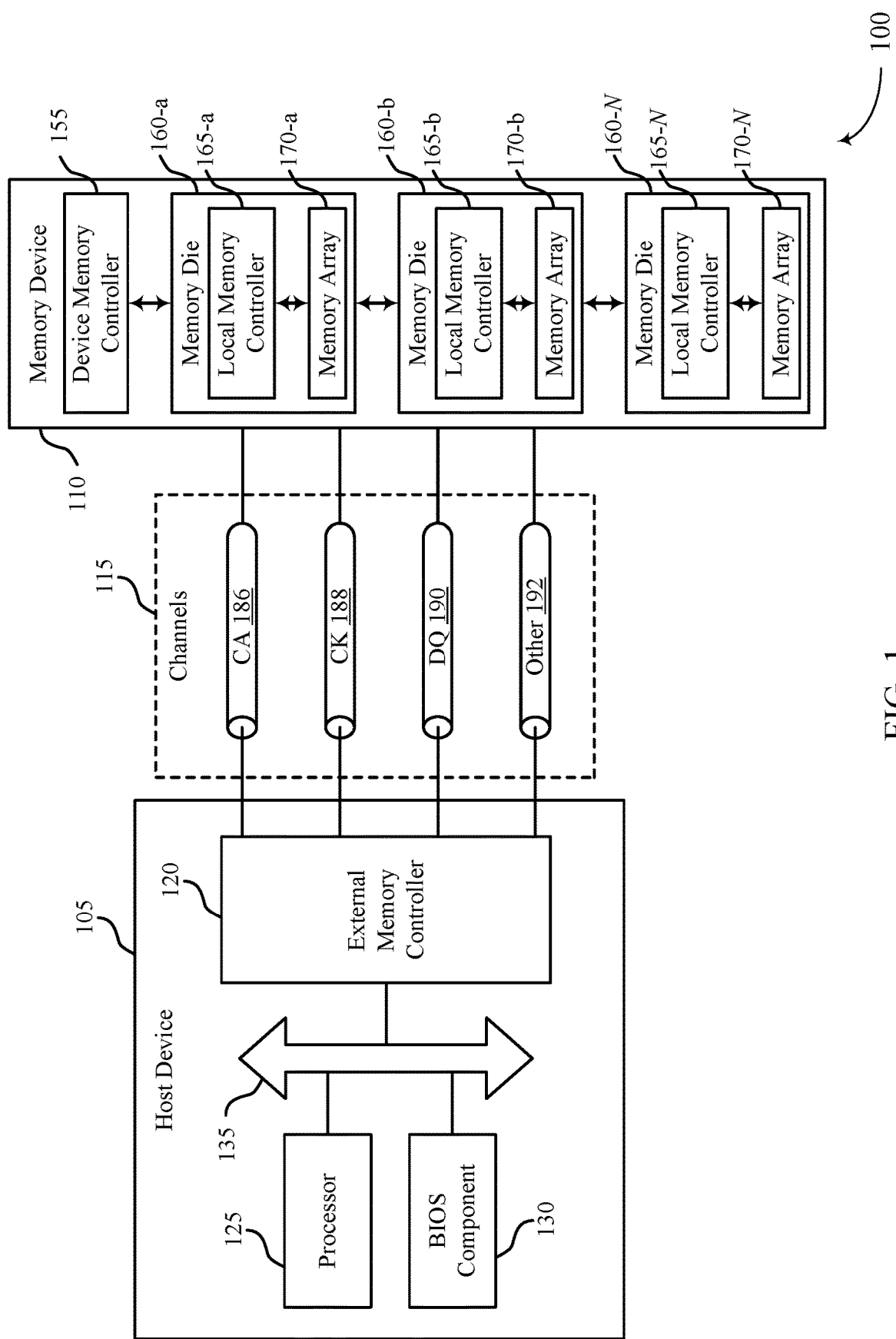
FIG. 1 illustrates an example of a system that supports dynamic random access memory speed bin compatibility in accordance with examples as disclosed herein.

A host device may communicate with a memory device. In some examples, the host device may transmit a command to the memory device requesting access to a memory array of or coupled with the memory device. The memory device may access the memory array according to a column address strobe (CAS) latency, which may represent a duration between when a command is received and when the memory device is available to transmit data to or receive data (or both) from the host device. In some examples, the host device may read a serial presence detect (SPD) of a memory module that includes or is related to the memory device that indicates a minimum array access delay (e.g., tAA), a set of available clock rates, or a set of available CAS latencies, or any combination thereof.

In some examples, the host device may downclock (e.g., reduce a clock rate) when coupled with a memory device that is configured to support a lower clock rate than the host device was configured to use before a condition, such as the host device being coupled with the memory device. In such examples, the host device may determine a CAS latency based on the minimum tAA and a clock duration associated with the clock rate to which the host device is to downclock. The host device may round the resulting CAS latency (e.g., may round up) to a next even integer and may verify that the rounded CAS latency is available. If the rounded CAS latency is available, the host device and the memory device may communicate according to the rounded CAS latency.

However, there may be examples in which the rounded CAS latency is indicated as available in the set of available CAS latencies. but is below a duration sufficient for the memory device to be available for receiving data or transmitting data. Accordingly, the host device may attempt to receive data from or transmit data to the memory device before the memory device is available to receive data or transmit data. Attempting to receive data from or transmit data to the memory device before the memory device is available for receiving data or transmitting data may result in an error or other disadvantages.

The techniques described herein may enable a device (e.g., a host device, a memory device, a system such as a system including a host device and a memory device) to determine a CAS latency with a duration sufficient for the memory device to be available for receiving data or transmitting data. For instance, the device may combine a first parameter (e.g., the clock duration) with a second parameter (e.g., a target tAA for a particular speed bin rounded up to a next even integer) to generate a third parameter, and may determine the CAS latency based on the third parameter satisfying a threshold (e.g., based on the third parameter being above a target tAA). After determining the CAS latency, the device may access one or more memory cells of the memory array based on the determined CAS latency.

Features of the disclosure are initially described in the context of systems and dies as described with reference to FIGS. 1 and 2. Features of the disclosure are described in the context of a decision flow as described with reference to FIG. 3. These and other features of the disclosure are further illustrated by and described with reference to an apparatus diagram and flowcharts that relate to dynamic random access memory speed bin compatibility as described with reference to FIGS. 4-6.

FIG. 1 illustrates an example of a system 100 that supports dynamic random access memory speed bin compatibility in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 *a*, memory die 160 *b*, memory die 160 N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

A host device 105 may communicate with a memory device 110. In some examples, the host device may transmit a command to the memory device 110 requesting access to a memory array 170 of the memory device 110. The memory device 110 may access the memory array 170 according to a CAS latency, which may represent a duration between when a command is received by the memory device 110 and when the memory device 110 is available to transmit data to or receive data from the host device 105. In some examples, the host device 105 may read a serial presence detect (SPD) of a memory module that includes the memory device 110 that indicates a minimum array access delay (tAA), a set of available clock rates, and a set of available CAS latencies.

In some examples, the host device 105 may downclock when coupled with a memory device 110 that is configured to support a lower clock rate than the host device 105 was configured to use before being coupled with the memory device 110. In such examples, the host device 105 may determine a CAS latency based on the minimum tAA and a clock duration associated with the clock rate to which the host device 105 is to downclock. The host device 105 may round the resulting CAS latency up to a next even integer and may verify that the rounded CAS latency is available. If the rounded CAS latency is available, the host device 105 and the memory device 110 may communicate according to the rounded CAS latency.

However, there may be examples in which the rounded CAS latency is indicated as available in the set of available CAS latencies but is below a duration sufficient for the memory device to be available for receiving data or transmitting data. Accordingly, the host device 105 may attempt to receive data from or transmit data to the memory device 110 before the memory device 110 is available to receive data or transmit data. Attempting to receive data from or transmit data to the memory device 110 before the memory device 110 is available for receiving data or transmitting data may result in an error.

The techniques described herein may enable a device (e.g., a host device 105, a memory device 110, a system 100) to determine a CAS latency with a duration sufficient for the memory device 110 to be available for receiving or transmitting data. For instance, the device may combine a first parameter (e.g., the clock duration) with a second parameter (e.g., tAA for a particular speed bin rounded according to a rounding algorithm and rounded up to a next even integer) to generate a third parameter and may determine the CAS latency based on the third parameter satisfying a threshold (e.g., based on the third parameter being above a target tAA). After determining the CAS latency, the device may access one or more memory cells of the memory array 170 based on the determined CAS latency.

Figure 2:
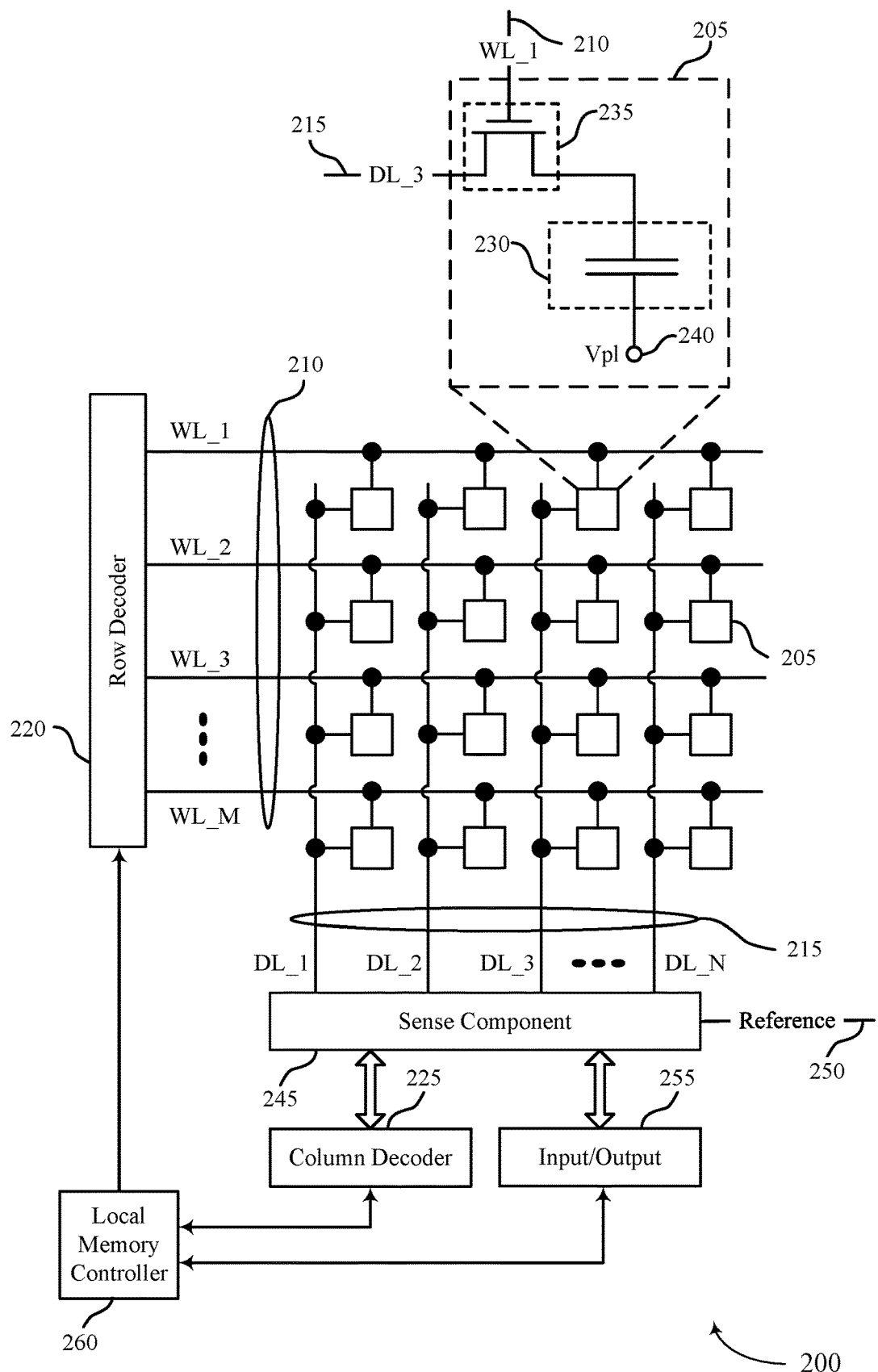
FIG. 2 illustrates an example of a memory die that supports dynamic random access memory speed bin compatibility in accordance with examples as disclosed herein.

FIG. 2 illustrates an example of a memory die 200 that supports dynamic random access memory speed bin compatibility in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be operable to couple and/or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state.

The local memory controller 260 may determine (e.g., identify) a target memory cell 205 on which to perform the write operation. The local memory controller 260 may determine (e.g., identify) a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may determine (e.g., identify) a target memory cell 205 on which to perform the read operation. The local memory controller 260 may determine (e.g., identify) a target word line 210 and a target digit line 215 coupled with the target memory cell 205 (e.g., address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some examples, the memory die 200 may access one or more memory cells 205 according to a column address strobe (CAS) latency, which may represent a duration between when a command is received and when the memory die 200 is available to transmit data to or receive data (or both) from a host device. In some examples, the CAS latency may be determined (e.g., by a host device coupled with the memory die 200) based on combining a first parameter (e.g., a clock duration according to which the memory die 200 operates) with a second parameter (e.g., a target tAA for a particular speed bin rounded up to a next even integer) to generate a third parameter. For instance, the CAS latency may be determined based on the third parameter satisfying a threshold (e.g., based on the third parameter being above a target tAA). After the CAS latency is determined, one or more memory cells 205 of the memory die 200 may be accessed according to the determined CAS latency.

Figure 3:
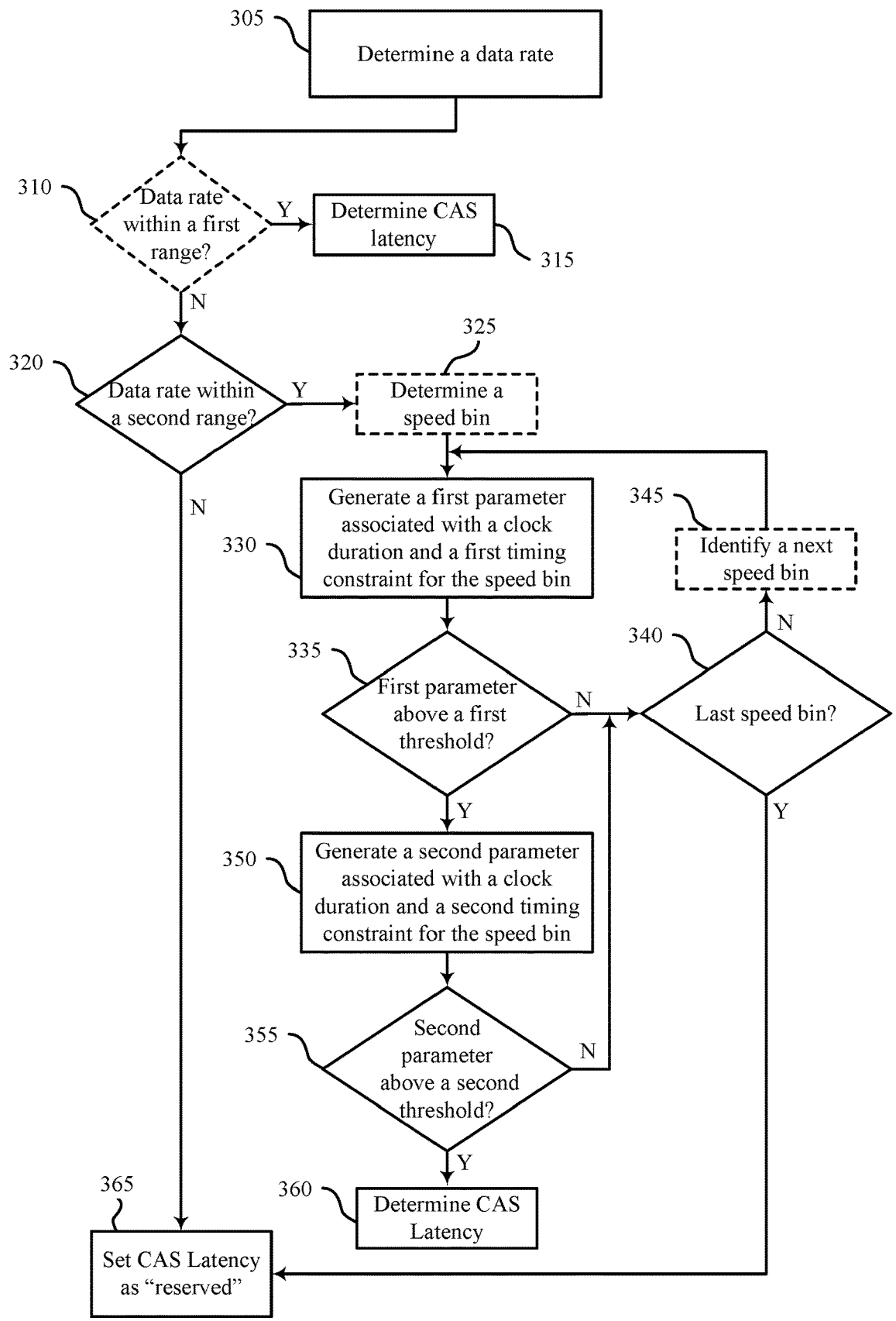
FIG. 3 illustrates an example of a decision flow that supports dynamic random access memory speed bin compatibility in accordance with examples as disclosed herein.

FIG. 3 illustrates an example of a decision flow 300 that supports dynamic random access memory speed bin compatibility in accordance with examples as disclosed herein. In some examples, decision flow 300 may be implemented by one or more aspects of system 100. For instance, decision flow 300 may represent one or more methods performed by a host device 105 or memory device 110 (or some combination), as described with reference to FIG. 1, in order to determine a CAS latency.

The methods described herein may be used to determine valid CAS latencies (e.g., listed in a speed bin table). For instance, the methods may enable the device to calculate supported CAS latencies by rounding the operating frequency (e.g., rounding up) to a different (e.g., a next faster) native speed bin (e.g., 3200 million transfers per second, 3600 million transfers per second). Using a resulting tCK (AVG)min and one or more bin target timings, the device may use a rounding algorithm to calculate a valid CAS latency. In examples where odd CAS latencies are not supported, odd CAS latencies may be rounded to a next even CAS latency. In some examples, when a data rate is between 1980 million transfers per second and 2100 million transfers per second, the CAS latency may be equal to 22. If a corrected tAA or a corrected tRCDtRP are violated, or if a slower tAA, row precharge delay (tRP), or row address to column address delay (tRCD) is to be used, the methods described herein may use a slower combination of a target tAA and a target tRCDtRP to return slower valid CAS latencies. In some examples, a corrected tAA and a corrected tRCDtRP may be calculated by reducing one or more of tAA(min), tRCD (min), and tRP(min) by a rounding algorithm correction factor.

At 305, a device (e.g., a host device or a memory device) may determine an application data rate (e.g., DataRate in units of million transfers per second) and may proceed to 310. The device may also, at 305, determine one or more of a rounding algorithm correction factor (e.g., CorrFact, which may have a value of 0.3%), a scaled correction factor (e.g., ScaledCorrFact, which may have a value of 997), a minimum tAA (e.g., tAAmin in units of picoseconds, which may have a value between 13750 and 17500 or between 16000 and 2000 or both), a minimum tRCD or tRP (e.g., tRCDtRPmin in picoseconds, which may have a value between 13750 and 17500) or both, a minimum clock duration (e.g., tCKmin), tAAmin corrected according to a rounding algorithm (e.g., tAAcorr in picoseconds), or tRCDtRPmin corrected according to a rounding algorithm (e.g., tRCDtRPcorr in units of picoseconds, or any combination thereof. In some examples, tCKmin may be determined as TRUNC(2000000/CEILING(DataRate, 400), where TRUNC( ) may represent a truncating operation and CEILING( ) may represent a ceiling operation. In some examples, tAAcorr may be determined as TRUNC (tAAmin*ScaledCorrFactor/1000) and tRCDtRPcorr may be determined as TRUNC(tRCDtRPmin*ScaledCorrFactor/1000). In some examples, a rounding algorithm (e.g., RA( )) for a given variable (e.g., tar g) may be represented as $$RA(targ) = TRUNC\left(\frac{targ * \frac{ScaledCorrFact}{tCKmin} + 1000}{1000}\right)$$

and may output a value in units of quantity of clock cycles (nCK). In some examples, tCKmin may be determined by rounding down tCK(AVG) to a next faster native speed.

At 310, a device (e.g., a host device or a memory device) may determine whether the data rate is within a first range. For instance, the device may determine whether the data rate is higher than a first threshold data rate (e.g., 1980≤DataRate), or whether the data rate is lower than second threshold data rate (e.g., DataRate≤2100), or both. If the data rate is within the first range, the device may proceed to 315. However, if the data rate is not within the first range, the device may proceed to 320. At 315, the device may determine the CAS latency based on the data rate being within the first range (e.g., the device may determine the CAS latency to be 22).

At 320, a device (e.g., a host device or a memory device) may determine whether the data rate is within a second range. For instance, the device may determine whether the data rate is higher than a third threshold data rate (e.g., 2933≤DataRate), or whether the data rate is lower than a fourth threshold data rate (e.g., DataRate≥8400), or both. If the data rate is within the second range, the device may proceed to 325. If the device is not within the second range, the device may proceed to 365.

At 325, a device (e.g., a host device or a memory device) may determine timing constraints for a first speed bin (e.g., an AN speed bin) and may proceed to 330. For instance, the device may determine a tAA target for the first speed bin (e.g., BinAN_tAAtarg in units of picoseconds) and a tRP or tRCD target for the first speed bin (e.g., BinAN_tRCDtRPtarg in units of picoseconds) or both.

At 330, a device (e.g., a host device or a memory device) may generate a first parameter associated with a clock duration (e.g., tCKmin) and a first timing constraint for the first speed bin (e.g., BinAN_tAAtarg). For instance, the device may round the first timing constraint according to the rounding algorithm; round the result to a next even integer; and may multiply the resulting even integer with tCKmin. For instance, the device may perform EVEN(RA(BinAN_tAAtarg))*tCKmin. After generating the first parameter, the device may proceed to 335. At 335, the device may determine whether the first parameter is above a first threshold (e.g., tAAcorr). For instance, the device may determine whether EVEN(RA(BinAN_tAAtarg))*tCKmin is greater than or equal to tAAcorr. If so, the device may proceed to 350. If not, the device may proceed to 340.

At 350, a device (e.g., a host device or a memory device) may generate a second parameter associated with the clock duration (e.g., tCKmin) and a second timing constraint for the first speed bin (e.g., BinAN_tRCDtRPtarg). For instance, the device may round the second timing constraint according to the rounding algorithm; round the result to a next even integer; and may multiply the resulting even integer with tCKmin. For instance, the device may perform EVEN(RA(BinAN_tRCDtRPtarg))*tCKmin. After generating the second parameter, the device may proceed to 355. At 355, the device may determine whether the second parameter is above a second threshold (e.g., tRCDtRPcorr). For instance, the device may determine whether EVEN(RA(BinAN_tRCDtRPtarg))*tCKmin is greater than or equal to tRCDtRPcorr. If so, the device may proceed to 360. If not, the device may proceed to 340.

At 340, a device (e.g., a host device or a memory device) may determine whether the first speed bin is the last speed bin in a set of speed bins. For instance, at 325, the device may initially select a speed bin with the lowest associated timing constraints of the set of speed bins (e.g., an AN bin). The device may determine that the speed bin at 340 is the last speed bin if the speed bin is associated with the highest timing constraints for the set of speed bins (e.g., the speed bin is a C bin). If the speed bin is the last speed bin, the device may proceed to 365. However, if the speed bin is not the last speed bin, the device may proceed to 345. At 345, in examples where the first speed is not the last speed bin, the device may determine timing constraints for a second speed bin of the set of speed bins. In some examples, the second speed bin may be a speed bin with the next lowest timing constraints relative to the first speed bin. For instance, in the present example, if the first parameter or the second parameter associated with the first speed bin (e.g., an AN bin) fails to satisfy the first threshold or the second threshold, respectively, the device may determine timing constraints for a second speed bin associated with the next lowest timing constraints (e.g., a B bin). The device may then proceed to 330.

If proceeding from 345, at 330 a device (e.g., a host device or a memory device) may generate a respective first parameter for the second speed bin (e.g., a B bin) associated with the clock duration (e.g., tCKmin) and a respective first timing constraint (e.g., BinB_tAAtarg). For instance, the device may round the respective first timing constraint according to the rounding algorithm; round the result to a next even integer; and may multiply the resulting even integer with tCKmin. For instance, the device may perform EVEN(RA(BinB_tAAtarg))*tCKmin. After generating the respective first parameter for the second speed bin, the device may proceed to 335. At 335, the device may determine whether the respective first parameter for the second speed bin is above the first threshold (e.g., tAAcorr). For instance, the device may determine whether EVEN(RA(BinB_tAAtarg))*tCKmin is greater than or equal to tAAcorr. If so, the device may proceed to 350. If not, the device may proceed to 340.

At 350, a device (e.g., a host device or a memory device) may generate, for the second speed bin (e.g., a B bin), a respective second parameter associated with the clock duration (e.g., tCKmin) and a respective second timing constraint for the second speed bin (e.g., BinB_tRCDtRPtarg). For instance, the device may round the respective second timing constraint according to the rounding algorithm; round the result to a next even integer; and may multiply the resulting even integer with tCKmin. For instance, the device may perform EVEN(RA(BinB_tRCDtRPtarg))*tCKmin. After generating the respective second parameter, the device may proceed to 355. At 355, the device may determine whether the respective second parameter for the second speed bin is above the second threshold (e.g., tRCDtRPcorr). For instance, the device may determine whether EVEN(RA(BinB_tRCDtRPtarg))*tCKmin is greater than or equal to tRCDtRPcorr. If so, the device may proceed to 360. If not, the device may proceed to 340.

At 340, a device (e.g., a host device or a memory device) may determine whether the second speed bin is the last speed bin in a set of speed bins. At 345, in examples where the second speed bin is not the last speed bin, the device may determine timing constraints for a third speed bin of the set of speed bins. In some examples, the third speed bin may be a speed bin with the next lowest timing constraints relative to the second speed bin. For instance, in the present example, if the respective first parameter or the respective second parameter associated with the second speed bin (e.g., a B bin) fails to satisfy the first threshold or the second threshold, respectively, the device may determine timing constraints for a third speed bin associated with the next lowest timing constraints (e.g., a BN bin). The device may then proceed to 330.

If proceeding from 345, at 330 a device (e.g., a host device or a memory device) may generate a respective first parameter for the third speed bin (e.g., a BN bin) associated with the clock duration (e.g., tCKmin) and a respective first timing constraint (e.g., BinB_tAAtarg). For instance, the device may round the respective first timing constraint according to the rounding algorithm; round the result to a next even integer; and may multiply the resulting even integer with tCKmin. For instance, the device may perform EVEN(RA(BinBN_tAAtarg))*tCKmin. After generating the respective first parameter for the third speed bin, the device may proceed to 335. At 335, the device may determine whether the respective first parameter for the third speed bin is above the first threshold (e.g., tAAcorr). For instance, the device may determine whether EVEN(RA(BinBN_tAAtarg))*tCKmin is greater than or equal to tAAcorr. If so, the device may proceed to 350. If not, the device may proceed to 340.

At 350, a device (e.g., a host device or a memory device) may generate, for the third speed bin (e.g., a BN bin), a respective second parameter associated with the clock duration (e.g., tCKmin) and a respective second timing constraint for the second speed bin (e.g., BinB_tRCDtRPtarg). For instance, the device may round the respective second timing constraint according to the rounding algorithm; round the result to a next even integer; and may multiply the resulting even integer with tCKmin. For instance, the device may perform EVEN(RA(BinBN_tRCDtRPtarg))*tCKmin. After generating the respective second parameter, the device may proceed to 355. At 355, the device may determine whether the respective second parameter for the third speed bin is above the second threshold (e.g., tRCDtRPcorr). For instance, the device may determine whether EVEN(RA(BinBN_tRCDtRPtarg))*tCKmin is greater than or equal to tRCDtRPcorr. If so, the device may proceed to 360. If not, the device may proceed to 340.

At 340, a device (e.g., a host device or a memory device) may determine whether the third speed bin is the last speed bin in a set of speed bins. At 345, in examples where the third speed is not the last speed bin, the device may determine timing constraints for a fourth speed bin of the set of speed bins. In some examples, the fourth speed bin may be a speed bin with the next lowest timing constraints relative to the second speed bin. For instance, in the present example, if the respective first parameter or the respective second parameter associated with the third speed bin (e.g., a BN bin) fails to satisfy the first threshold or the second threshold, respectively, the device may determine timing constraints for a fourth speed bin associated with the next lowest timing constraints (e.g., a C bin). The device may then proceed to 330.

If proceeding from 345, at 330 a device (e.g., a host device or a memory device) may generate a respective first parameter for the fourth speed bin (e.g., a C bin) associated with the clock duration (e.g., tCKmin) and a respective first timing constraint (e.g., BinC_tAAtarg). For instance, the device may round the respective first timing constraint according to the rounding algorithm; round the result to a next even integer; and may multiply the resulting even integer with tCKmin. For instance, the device may perform EVEN(RA(BinC_tAAtarg))*tCKmin. After generating the respective first parameter for the second speed bin, the device may proceed to 335. At 335, the device may determine whether the respective first parameter for the fourth speed bin is above the first threshold (e.g., tAAcorr). For instance, the device may determine whether EVEN(RA(BinC_tAAtarg))*tCKmin is greater than or equal to tAAcorr. If so, the device may proceed to 350. If not, the device may proceed to 340.

At 350, a device (e.g., a host device or a memory device) may generate, for the fourth speed bin (e.g., a C bin), a respective second parameter associated with the clock duration (e.g., tCKmin) and a respective second timing constraint for the fourth speed bin (e.g., BinC_tRCDtRPtarg). For instance, the device may round the respective second timing constraint according to the rounding algorithm; round the result to a next even integer; and may multiply the resulting even integer with tCKmin. For instance, the device may perform EVEN(RA(BinC_tRCDtRPtarg))*tCKmin. After generating the respective second parameter, the device may proceed to 355. At 355, the device may determine whether the respective second parameter for the fourth speed bin is above the second threshold (e.g., tRCDtRPcorr). For instance, the device may determine whether EVEN(RA(BinC_tRCDtRPtarg))*tCKmin is greater than or equal to tRCDtRPcorr. If so, the device may proceed to 360. If not, the device may proceed to 340.

At 340, a device (e.g., a host device or a memory device) may determine whether the fourth speed bin is the last speed bin in a set of speed bins. At 345, in examples where the fourth speed bin is not the last speed bin, the device may determine timing constraints for a fifth speed bin of the set of speed bins. In some examples, the fifth speed bin may be a speed bin with the next lowest timing constraints relative to the fourth speed bin. The device may then proceed to 330. However, if the fourth speed bin is the last speed bin of the set of speed bins, the device may proceed to 365.

At 360, a device (e.g., a host device or a memory device) may determine the CAS latency according to the speed bin whose respective first and second parameters satisfied the respective first and second thresholds. In a first example, if the first parameter for the first speed bin (e.g., an AN bin) satisfies the first threshold and the second parameter for the first speed bin satisfies the second threshold, the device may determine the CAS latency according to the first speed bin (e.g., the CAS latency may be determined as EVEN(RA(BinAN_tAAtarg))). In a second example, if either of the respective first or second parameters for the first speed bin fails to satisfy the first threshold and the second threshold but the respective first and second parameters for the second speed bin satisfy the first threshold and the second threshold, respectively, the device may determine the CAS latency according to the second speed bin (e.g., the CAS latency may be determined as EVEN(RA(BinB_tAAtarg))). In a third example, if either of the respective first or second parameters for the first speed bin and the second speed bin fails to satisfy the first threshold and the second threshold but the respective first and second parameters for the third speed bin satisfy the first threshold and the second threshold, respectively, the device may determine the CAS latency according to the third speed bin (e.g., the CAS latency may be determined as EVEN(RA(BinBN_tAAtarg))). In a fourth example, if either of the respective first or second parameters for the first speed bin, the second speed bin, and the third speed bin fails to satisfy the first threshold and the second threshold but the respective first and second parameters for the fourth speed bin satisfy the first threshold and the second threshold, respectively, the device may determine the CAS latency according to the fourth speed bin (e.g., the CAS latency may be determined as EVEN(RA(BinC_tAAtarg))).

At 365, a device (e.g., a host device or a memory device) may set the CAS latency as reserved. Setting the CAS latency as reserved may indicate that the device may not determine a CAS latency for the device when the data rate is within the second range.

In some examples, BinAN_tAAtarg may have a value of 16000 picoseconds (e.g., for a 3DS package). In some examples, BinB_tAAtarg may have a value of 16000 picoseconds (e.g., for a mono package) or 18500 picoseconds (e.g., for a 3DS package). In some examples, BinBN_tAAtarg may have a value of 16000 picoseconds (e.g., for a mono package) or 18500 picoseconds (e.g., for a 3DS package) and BinBN_tRCDtRPtarg may have a value of 16000 picoseconds (e.g., for a mono package or a 3DS package). In some examples, BinC_tAAtarg may have a value of 17500 picoseconds (e.g., for a mono package) or 20000 picoseconds (e.g., for a 3DS package). In some examples, BinC_tRCDtRPtarg may have a value of 17500 picoseconds (e.g., for a mono package or a 3DS package). In some examples, if the data rate is less than 3200 million transfers per second, BinAN_tAAtarg or BinBN_tRCDtRPtarg (or both) may have a value of 13750 picoseconds (e.g., for a mono package) or 14000 picoseconds (e.g., for a 3DS package). Alternatively, BinAN_tAAtarg or BinBN_tRCDtRPtarg (or both) may have a value of 14000 picoseconds (e.g., for a mono package or for a 3DS package). Additionally or alternatively, if the data rate is less than 3600 million transfers per second, BinB_tRCDtRPtarg may have a value that is equal to 16250 picoseconds (e.g., for a mono package) or 16000 picoseconds (e.g., for a 3DS package). In some examples BinB_tRCDtRPtarg may have a value equal to 16250 picoseconds according to $$16250 = \left(\frac{2000000}{3200}\right) * EVEN \left(TRUNC\left(\frac{BinB_{tRCDtRPtarg} * \frac{ScaledcorrFact}{2000000} + 1000}{\frac{3200}{1000}}\right)\right).$$

Although described as being performed by a device (e.g., a host device or a memory device), the various actions can be performed by a host device, or a memory device, or some combination of both, among other examples and potential devices.

Figure 4:
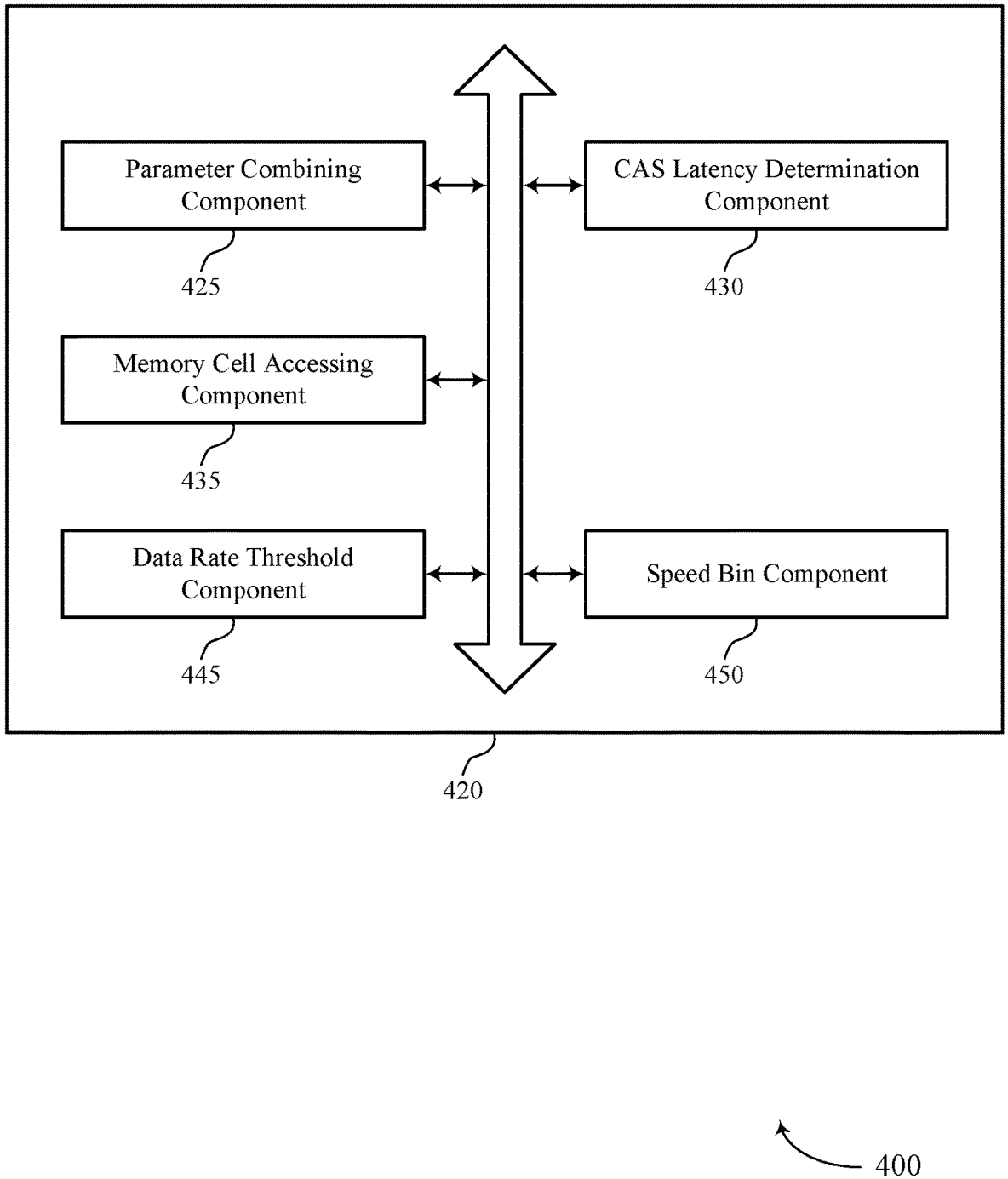
FIG. 4 shows a block diagram of a memory device that supports dynamic random access memory speed bin compatibility in accordance with examples as disclosed herein.

FIG. 4 shows a block diagram 400 of a device 420 that supports dynamic random access memory speed bin compatibility in accordance with examples as disclosed herein. The device 420 may be an example of aspects of a host device, a memory device, or a system including the host device and the memory device as described with reference to FIGS. 1 through 3. The device 420, or various components thereof, may be an example of means for performing various aspects of dynamic random access memory speed bin compatibility as described herein, for instance, with reference to FIGS. 1 through 3. For example, the device 420 may include a parameter combining component 425, a CAS latency determination component 430, a memory cell accessing component 435, a data rate threshold component 445, a speed bin component 450, or any combination thereof. Each of these components may communicate, directly or indirectly, with one another (e.g., via one or more buses).

The parameter combining component 425 may be configured as or otherwise support a means for combining a first parameter with a second parameter to generate a third parameter, where the first parameter is associated with a duration for a clock that is coupled with a memory array to perform a clock cycle and the second parameter corresponds to a timing constraint associated with initiating an access operation for the memory array. The CAS latency determination component 430 may be configured as or otherwise support a means for determining a latency of a CAS based at least in part on the third parameter satisfying a threshold value and on a data rate at which the memory array is operated satisfying a threshold data rate. The memory cell accessing component 435 may be configured as or otherwise support a means for accessing one or more memory cells of the memory array based at least in part on the latency of the CAS.

In some examples, the parameter combining component 425 may be configured as or otherwise support a means for combining the first parameter with a fourth parameter to generate a fifth parameter, where the fourth parameter is associated with a second timing constraint associated with a row address strobe of the memory array, and where determining the latency of the CAS is based at least in part on combining the first parameter with the fourth parameter.

In some examples, determining the latency of the CAS is based at least in part on the fourth parameter satisfying a second threshold value.

In some examples, combining the first parameter with the second parameter is based at least in part on the fourth parameter failing to satisfy a second threshold value.

In some examples, the parameter combining component 425 may be configured as or otherwise support a means for combining the first parameter with a fourth parameter to generate a fifth parameter, where the fourth parameter corresponds to a second timing constraint associated with initiating the access operation for the memory array, and where determining the latency of the CAS is based at least in part on the fourth parameter failing to satisfy the threshold value.

In some examples, the data rate threshold component 445 may be configured as or otherwise support a means for determining that the data rate satisfies the threshold data rate and is below a second threshold data rate that is higher than the threshold data rate, where determining the latency of the CAS is based at least in part on the data rate satisfying the threshold data rate and being below the second threshold data rate that is higher than the threshold data rate.

In some examples, the data rate threshold component 445 may be configured as or otherwise support a means for determining that the data rate fails to satisfy a second threshold data rate, where combining the first parameter with the second parameter is based at least in part on the data rate failing to satisfy the second threshold data rate.

In some examples, the parameter combining component 425 may be configured as or otherwise support a means for combining a first parameter with a second parameter to generate a third parameter, where the first parameter is associated with a duration for a clock that is coupled with a memory array to perform a clock cycle and the second parameter is associated with a first timing constraint associated with initiating an access operation for the memory array. In some examples, the parameter combining component 425 may be configured as or otherwise support a means for combining the first parameter with a fourth parameter to generate a fifth parameter, where the fourth parameter is associated with a second timing constraint associated with a row address strobe of the memory array. In some examples, the CAS latency determination component 430 may be configured as or otherwise support a means for determining a latency of a CAS based at least in the third parameter satisfying a first threshold and the fifth parameter satisfying a second threshold. In some examples, the memory cell accessing component 435 may be configured as or otherwise support a means for accessing one or more memory cells of the memory array based at least in part on the latency of the CAS.

In some examples, the parameter combining component 425 may be configured as or otherwise support a means for combining the first parameter with a sixth parameter to generate a seventh parameter, where the sixth parameter is associated with a third timing constraint associated with initiating the access operation for the memory array, and where combining the first parameter with the second parameter is based at least in part on the sixth parameter failing to satisfy the first threshold.

In some examples, the speed bin component 450 may be configured as or otherwise support a means for determining that the first timing constraint is associated with a first speed bin and the third timing constraint is associated with a second speed bin.

In some examples, the third timing constraint is higher than the first timing constraint based at least in part on the first timing constraint being associated with the first speed bin and the third timing constraint being associated with the second speed bin.

In some examples, the parameter combining component 425 may be configured as or otherwise support a means for combining the first parameter with a sixth parameter to generate a seventh parameter, where the sixth parameter is associated with a third timing constraint associated with the row address strobe of the memory array, and where combining the first parameter with the fourth parameter is based at least in part on the sixth parameter failing to satisfy the second threshold.

In some examples, the speed bin component 450 may be configured as or otherwise support a means for determining that the second timing constraint is associated with a first speed bin and the third timing constraint is associated with a second speed bin.

In some examples, the third timing constraint is higher than the second timing constraint based at least in part on the second timing constraint being associated with the first speed bin and the third timing constraint being associated with the second speed bin.

In some examples, the parameter combining component 425 may be configured as or otherwise support a means for generating the first parameter based at least in part on rounding up a sixth parameter associated with the duration for the clock according to a granularity corresponding to a frequency.

In some examples, the CAS latency determination component 430 may be configured as or otherwise support a means for determining the first threshold and the second threshold based at least in part on a correction factor.

In some examples, the first timing constraint includes an array access delay. In some examples, the second timing constraint includes one of a row precharge delay or a row address to column address delay.

In some examples, the first parameter includes a minimum clock duration.

Figure 5:
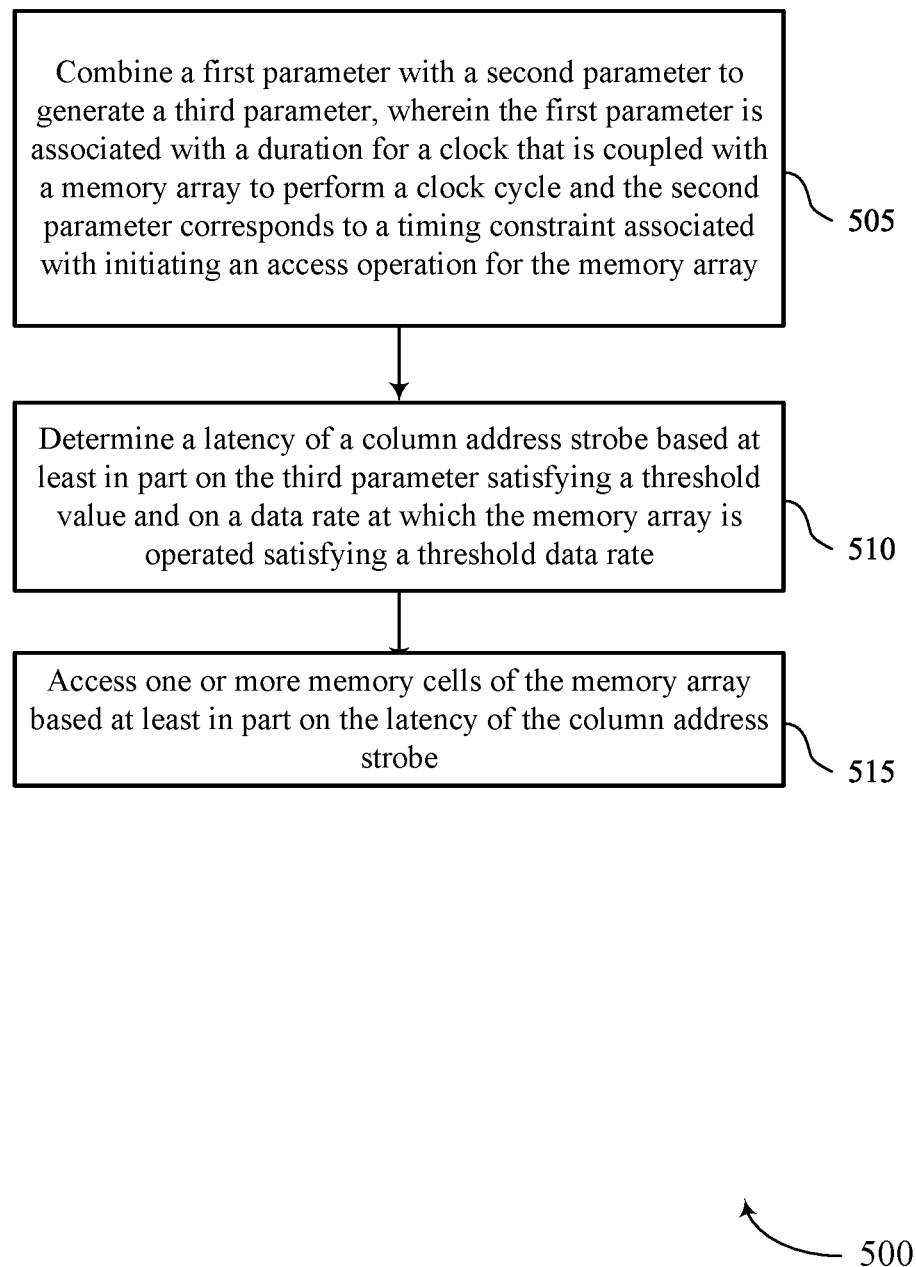
FIGS. 5 and 6 show flowcharts illustrating a method or methods that support dynamic random access memory speed bin compatibility in accordance with examples as disclosed herein.

FIG. 5 shows a flowchart illustrating a method 500 that supports dynamic random access memory speed bin compatibility in accordance with examples as disclosed herein. The operations of method 500 may be implemented by a host device, a memory device, or their components as described herein, for instance, with reference to FIGS. 1 through 4. For example, the operations of method 500 may be performed by a host device, a memory device, or a system including the host device and the memory device as described with reference to FIGS. 1 through 4. In some examples, a memory device may execute a set of instructions to control the functional elements of the device to perform the described functions. Additionally or alternatively, the memory device may perform aspects of the described functions using special-purpose hardware.

At 505, the method may include combining a first parameter with a second parameter to generate a third parameter, where the first parameter is associated with a duration for a clock that is coupled with a memory array to perform a clock cycle and the second parameter corresponds to a timing constraint associated with initiating an access operation for the memory array. The operations of 505 may be performed in accordance with examples as disclosed herein. In some examples, aspects of the operations of 505 may be performed by a parameter combining component 425 as described with reference to FIG. 4.

At 510, the method may include determining a latency of a column address strobe based at least in part on the third parameter satisfying a threshold value and on a data rate at which the memory array is operated satisfying a threshold data rate. The operations of 510 may be performed in accordance with examples as disclosed herein. In some examples, aspects of the operations of 510 may be performed by a CAS latency determination component 430 as described with reference to FIG. 4.

At 515, the method may include accessing one or more memory cells of the memory array based at least in part on the latency of the column address strobe. The operations of 515 may be performed in accordance with examples as disclosed herein. In some examples, aspects of the operations of 515 may be performed by a memory cell accessing component 435 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for combining a first parameter with a second parameter to generate a third parameter, where the first parameter is associated with a duration for a clock that is coupled with a memory array to perform a clock cycle and the second parameter corresponds to a timing constraint associated with initiating an access operation for the memory array, determining a latency of a CAS based at least in part on the third parameter satisfying a threshold value and on a data rate at which the memory array is operated satisfying a threshold data rate, and accessing one or more memory cells of the memory array based at least in part on the latency of the CAS.

Some examples of the method 500 and the apparatus described herein may further include operations, features, circuitry, logic, means, or instructions for combining the first parameter with a fourth parameter to generate a fifth parameter, where the fourth parameter may be associated with a second timing constraint associated with a row address strobe of the memory array, and where determining the latency of the CAS may be based at least in part on combining the first parameter with the fourth parameter.

Some examples of the method 500 and the apparatus described herein may further include operations, features, circuitry, logic, means, or instructions for determining the latency of the CAS based at least in part on the fourth parameter satisfying a second threshold value.

Some examples of the method 500 and the apparatus described herein may further include operations, features, circuitry, logic, means, or instructions for combining the first parameter with the second parameter based at least in part on the fourth parameter failing to satisfy a second threshold value.

Some examples of the method 500 and the apparatus described herein may further include operations, features, circuitry, logic, means, or instructions for combining the first parameter with a fourth parameter to generate a fifth parameter, where the fourth parameter corresponds to a second timing constraint associated with initiating the access operation for the memory array, and where determining the latency of the CAS may be based at least in part on the fourth parameter failing to satisfy the threshold value.

Some examples of the method 500 and the apparatus described herein may further include operations, features, circuitry, logic, means, or instructions for determining that the data rate satisfies the threshold data rate and may be below a second threshold data rate that may be higher than the threshold data rate, where determining the latency of the CAS may be based at least in part on the data rate satisfying the threshold data rate and being below the second threshold data rate that may be higher than the threshold data rate.

Some examples of the method 500 and the apparatus described herein may further include operations, features, circuitry, logic, means, or instructions for determining that the data rate fails to satisfy a second threshold data rate, where combining the first parameter with the second parameter may be based at least in part on the data rate failing to satisfy the second threshold data rate.

Figure 6:
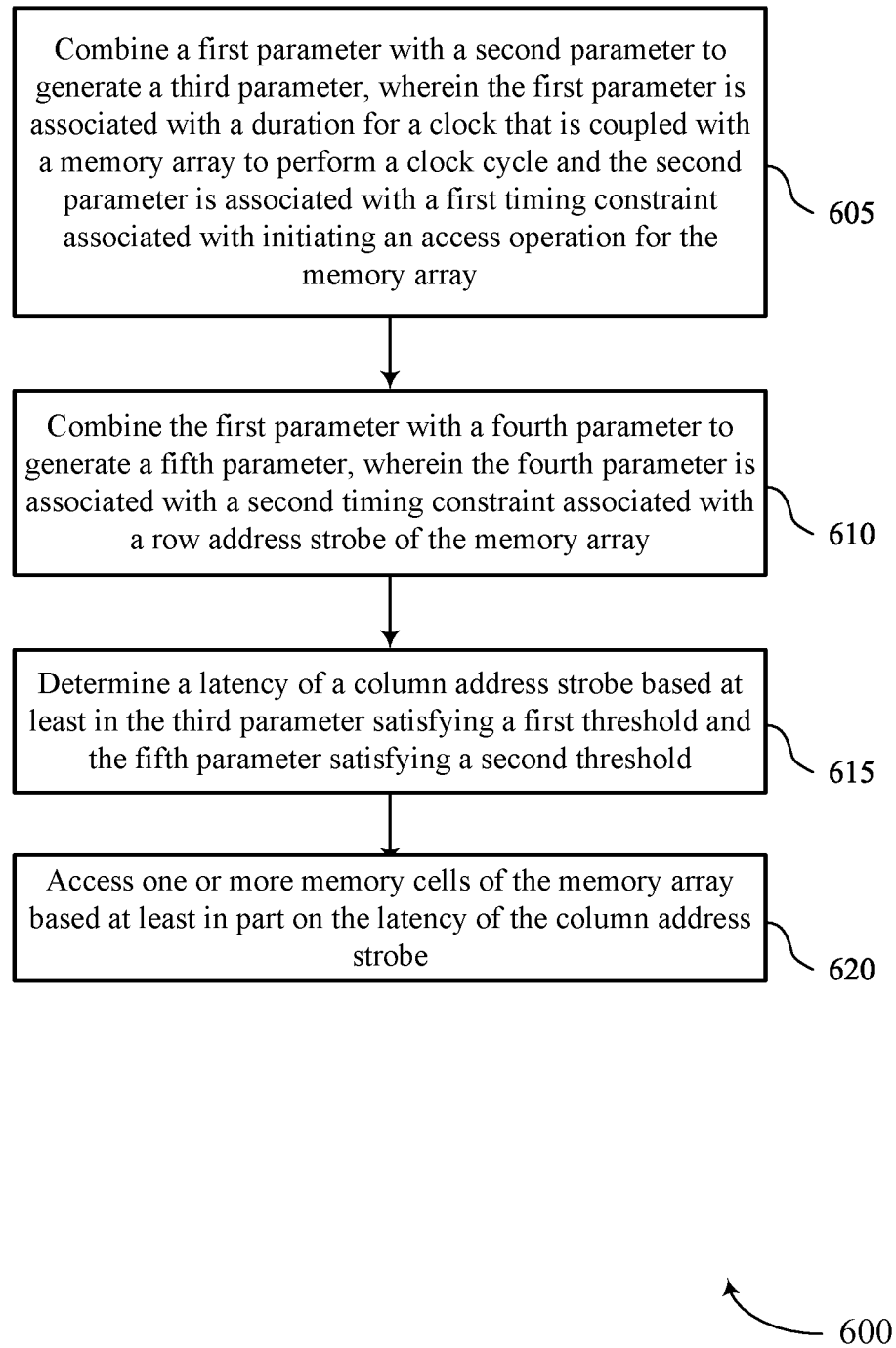

FIG. 6 shows a flowchart illustrating a method 600 that supports dynamic random access memory speed bin compatibility in accordance with examples as disclosed herein. The operations of method 600 may be implemented by a host device, a memory device, or their components as described herein, for instance, with reference to FIGS. 1 through 4. For example, the operations of method 600 may be performed by a host device, a memory device, or a system including the host device and the memory device as described with reference to FIGS. 1 through 4. In some examples, a memory device may execute a set of instructions to control the functional elements of the device to perform the described functions. Additionally or alternatively, the memory device may perform aspects of the described functions using special-purpose hardware.

At 605, the method may include combining a first parameter with a second parameter to generate a third parameter, where the first parameter is associated with a duration for a clock that is coupled with a memory array to perform a clock cycle and the second parameter is associated with a first timing constraint associated with initiating an access operation for the memory array. The operations of 605 may be performed in accordance with examples as disclosed herein. In some examples, aspects of the operations of 605 may be performed by a parameter combining component 425 as described with reference to FIG. 4.

At 610, the method may include combining the first parameter with a fourth parameter to generate a fifth parameter, where the fourth parameter is associated with a second timing constraint associated with a row address strobe of the memory array. The operations of 610 may be performed in accordance with examples as disclosed herein. In some examples, aspects of the operations of 610 may be performed by a parameter combining component 425 as described with reference to FIG. 4.

At 615, the method may include determining a latency of a column address strobe based at least in the third parameter satisfying a first threshold and the fifth parameter satisfying a second threshold. The operations of 615 may be performed in accordance with examples as disclosed herein. In some examples, aspects of the operations of 615 may be performed by a CAS latency determination component 430 as described with reference to FIG. 4.

At 620, the method may include accessing one or more memory cells of the memory array based at least in part on the latency of the column address strobe. The operations of 620 may be performed in accordance with examples as disclosed herein. In some examples, aspects of the operations of 620 may be performed by a memory cell accessing component 435 as described with reference to FIG. 4.

In some examples, an apparatus as described herein may perform a method or methods, such as the method 600. The apparatus may include, features, circuitry, logic, means, or instructions (e.g., a non-transitory computer-readable medium storing instructions executable by a processor) for combining a first parameter with a second parameter to generate a third parameter, where the first parameter is associated with a duration for a clock that is coupled with a memory array to perform a clock cycle and the second parameter is associated with a first timing constraint associated with initiating an access operation for the memory array, combining the first parameter with a fourth parameter to generate a fifth parameter, where the fourth parameter is associated with a second timing constraint associated with a row address strobe of the memory array, determining a latency of a CAS based at least in the third parameter satisfying a first threshold and the fifth parameter satisfying a second threshold, and accessing one or more memory cells of the memory array based at least in part on the latency of the CAS.

Some examples of the method 600 and the apparatus described herein may further include operations, features, circuitry, logic, means, or instructions for combining the first parameter with a sixth parameter to generate a seventh parameter, where the sixth parameter may be associated with a third timing constraint associated with initiating the access operation for the memory array, and where combining the first parameter with the second parameter may be based at least in part on the sixth parameter failing to satisfy the first threshold.

Some examples of the method 600 and the apparatus described herein may further include operations, features, circuitry, logic, means, or instructions for determining that the first timing constraint may be associated with a first speed bin and the third timing constraint may be associated with a second speed bin.

In some examples of the method 600 and the apparatus described herein, the third timing constraint may be higher than the first timing constraint based at least in part on the first timing constraint being associated with the first speed bin and the third timing constraint being associated with the second speed bin.

Some examples of the method 600 and the apparatus described herein may further include operations, features, circuitry, logic, means, or instructions for combining the first parameter with a sixth parameter to generate a seventh parameter, where the sixth parameter may be associated with a third timing constraint associated with the row address strobe of the memory array, and where combining the first parameter with the fourth parameter may be based at least in part on the sixth parameter failing to satisfy the second threshold.

Some examples of the method 600 and the apparatus described herein may further include operations, features, circuitry, logic, means, or instructions for determining that the second timing constraint may be associated with a first speed bin and the third timing constraint may be associated with a second speed bin.

In some examples of the method 600 and the apparatus described herein, the third timing constraint may be higher than the second timing constraint based at least in part on the second timing constraint being associated with the first speed bin and the third timing constraint being associated with the second speed bin.

Some examples of the method 600 and the apparatus described herein may further include operations, features, circuitry, logic, means, or instructions for generating the first parameter based at least in part on rounding up a sixth parameter associated with the duration for the clock according to a granularity corresponding to a frequency.

Some examples of the method 600 and the apparatus described herein may further include operations, features, circuitry, logic, means, or instructions for determining the first threshold and the second threshold based at least in part on a correction factor.

In some examples of the method 600 and the apparatus described herein, the first timing constraint includes an array access delay, and the second timing constraint includes one of a row precharge delay or a row address to column address delay.

In some examples of the method 600 and the apparatus described herein, the first parameter includes a minimum clock duration.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a memory array including an array of memory cells that each include capacitive storage elements and a circuit coupled with the memory array and configured to cause the apparatus to: combine a first parameter with a second parameter to generate a third parameter, where the first parameter is associated with a duration for a clock that is coupled with the memory array to perform a clock cycle and the second parameter corresponds to a timing constraint associated with initiating an access operation for the memory array, determine a latency of a CAS based at least in part on the third parameter satisfying a threshold value and on a data rate at which the memory array is operated satisfying a threshold data rate, and access one or more memory cells of the memory array based at least in part on the latency of the CAS.

In some examples, the circuit may be further configured to cause the apparatus to combine the first parameter with a fourth parameter to generate a fifth parameter, where the fourth parameter may be associated with a second timing constraint associated with a row address strobe of the memory array, where determining the latency of the CAS may be based at least in part on combining the first parameter with the fourth parameter.

In some examples, the circuit may be further configured to cause the apparatus to determine the latency of the CAS based at least in part on the fourth parameter satisfying a second threshold value.

In some examples, the circuit may be further configured to cause the apparatus to combine the first parameter with the second parameter based at least in part on the fourth parameter failing to satisfy a second threshold value.

In some examples, the circuit may be further configured to cause the apparatus to combine the first parameter with a fourth parameter to generate a fifth parameter, where the fourth parameter corresponds to a second timing constraint associated with initiating the access operation for the memory array, and where determining the latency of the CAS may be based at least in part on the fourth parameter failing to satisfy the threshold value.

In some examples, the circuit may be further configured to cause the apparatus to determine that the data rate satisfies the threshold data rate and may be below a second threshold data rate that may be higher than the threshold data rate, where determining the latency of the CAS may be based at least in part on the data rate satisfying the threshold data rate and being below the second threshold data rate that may be higher than the threshold data rate.

In some examples, the circuit may be further configured to cause the apparatus to determine that the data rate fails to satisfy a second threshold data rate, where combining the first parameter with the second parameter may be based at least in part on the data rate failing to satisfy the second threshold data rate.

Another apparatus is described. The apparatus may include a memory array including an array of memory cells that each include capacitive storage elements and a circuit coupled with the memory array and configured to cause the apparatus to: combine a first parameter with a second parameter to generate a third parameter, where the first parameter is associated with a duration for a clock that is coupled with the memory array to perform a clock cycle and the second parameter is associated with a first timing constraint associated with initiating an access operation for the memory array, combine the first parameter with a fourth parameter to generate a fifth parameter, where the fourth parameter is associated with a second timing constraint associated with a row address strobe of the memory array, determine a latency of a CAS based at least in the third parameter satisfying a first threshold and the fifth parameter satisfying a second threshold, and access one or more memory cells of the memory array based at least in part on the latency of the CAS.

In some examples, the circuit may be further configured to cause the apparatus to combine the first parameter with a sixth parameter to generate a seventh parameter, where the sixth parameter may be associated with a third timing constraint associated with initiating the access operation for the memory array, and where combining the first parameter with the second parameter may be based at least in part on the sixth parameter failing to satisfy the first threshold.

In some examples, the circuit may be further configured to cause the apparatus to determine that the first timing constraint may be associated with a first speed bin and the third timing constraint may be associated with a second speed bin.

In some examples of the apparatus, the third timing constraint may be higher than the first timing constraint based at least in part on the first timing constraint being associated with the first speed bin and the third timing constraint being associated with the second speed bin.

In some examples, the circuit may be further configured to cause the apparatus to combine the first parameter with a sixth parameter to generate a seventh parameter, where the sixth parameter may be associated with a third timing constraint associated with the row address strobe of the memory array, and where combining the first parameter with the fourth parameter may be based at least in part on the sixth parameter failing to satisfy the second threshold.

In some examples, the circuit may be further configured to cause the apparatus to determine that the second timing constraint may be associated with a first speed bin and the third timing constraint may be associated with a second speed bin.

In some examples of the apparatus, the third timing constraint may be higher than the second timing constraint based at least in part on the second timing constraint being associated with the first speed bin and the third timing constraint being associated with the second speed bin.

In some examples of the apparatus, the circuit may be further configured to cause the apparatus to generate the first parameter based at least in part on rounding up a sixth parameter associated with the duration for the clock according to a granularity corresponding to a frequency.

In some examples of the apparatus, the circuit may be further configured to cause the apparatus to determine the first threshold and the second threshold based at least in part on a correction factor.

In some examples of the apparatus, the first timing constraint includes an array access delay, and the second timing constraint includes one of a row precharge delay or a row address to column address delay.

In some examples of the apparatus, the first parameter includes a minimum clock duration.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive.

A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
combining a first parameter with a second parameter to generate a third parameter, wherein the first parameter is associated with a duration for a clock that is coupled with a memory array to perform a clock cycle and the second parameter corresponds to a timing constraint associated with initiating an access operation for the memory array;
determining a latency of a column address strobe based at least in part on the third parameter satisfying a threshold value and on a data rate at which the memory array is operated satisfying a threshold data rate; and
accessing one or more memory cells of the memory array based at least in part on the latency of the column address strobe.

2. The method of claim 1, further comprising:
combining the first parameter with a fourth parameter to generate a fifth parameter, wherein the fourth parameter is associated with a second timing constraint associated with a row address strobe of the memory array, and wherein determining the latency of the column address strobe is based at least in part on combining the first parameter with the fourth parameter.

3. The method of claim 2, wherein determining the latency of the column address strobe is based at least in part on the fourth parameter satisfying a second threshold value.

4. The method of claim 2, wherein combining the first parameter with the second parameter is based at least in part on the fourth parameter failing to satisfy a second threshold value.

5. The method of claim 1, further comprising:
combining the first parameter with a fourth parameter to generate a fifth parameter, wherein the fourth parameter corresponds to a second timing constraint associated with initiating the access operation for the memory array, and wherein determining the latency of the column address strobe is based at least in part on the fourth parameter failing to satisfy the threshold value.

6. The method of claim 1, further comprising:
determining that the data rate satisfies the threshold data rate and is below a second threshold data rate that is higher than the threshold data rate, wherein determining the latency of the column address strobe is based at least in part on the data rate satisfying the threshold data rate and being below the second threshold data rate that is higher than the threshold data rate.

7. The method of claim 1, further comprising:
determining that the data rate fails to satisfy a second threshold data rate, wherein combining the first parameter with the second parameter is based at least in part on the data rate failing to satisfy the second threshold data rate.

8. A method, comprising:
combining a first parameter with a second parameter to generate a third parameter, wherein the first parameter is associated with a duration for a clock that is coupled with a memory array to perform a clock cycle and the second parameter is associated with a first timing constraint associated with initiating an access operation for the memory array;
combining the first parameter with a fourth parameter to generate a fifth parameter, wherein the fourth parameter is associated with a second timing constraint associated with a row address strobe of the memory array;
determining a latency of a column address strobe based at least in the third parameter satisfying a first threshold and the fifth parameter satisfying a second threshold; and
accessing one or more memory cells of the memory array based at least in part on the latency of the column address strobe.

9. The method of claim 8, further comprising:
combining the first parameter with a sixth parameter to generate a seventh parameter, wherein the sixth parameter is associated with a third timing constraint associated with initiating the access operation for the memory array, and wherein combining the first parameter with the second parameter is based at least in part on the sixth parameter failing to satisfy the first threshold.

10. The method of claim 9, further comprising:
determining that the first timing constraint is associated with a first speed bin and the third timing constraint is associated with a second speed bin.

11. The method of claim 10, wherein the third timing constraint is higher than the first timing constraint based at least in part on the first timing constraint being associated with the first speed bin and the third timing constraint being associated with the second speed bin.

12. The method of claim 8, further comprising:
combining the first parameter with a sixth parameter to generate a seventh parameter, wherein the sixth parameter is associated with a third timing constraint associated with the row address strobe of the memory array, and wherein combining the first parameter with the fourth parameter is based at least in part on the sixth parameter failing to satisfy the second threshold.

13. The method of claim 12, further comprising:
determining that the second timing constraint is associated with a first speed bin and the third timing constraint is associated with a second speed bin.

14. The method of claim 13, wherein the third timing constraint is higher than the second timing constraint based at least in part on the second timing constraint being associated with the first speed bin and the third timing constraint being associated with the second speed bin.

15. The method of claim 8, further comprising:
generating the first parameter based at least in part on rounding up a sixth parameter associated with the duration for the clock according to a granularity corresponding to a frequency.

16. The method of claim 8, further comprising:
determining the first threshold and the second threshold based at least in part on a correction factor.

17. The method of claim 8, wherein
the first timing constraint comprises an array access delay, and
the second timing constraint comprises one of a row precharge delay or a row address to column address delay.

18. The method of claim 8, wherein the first parameter comprises a minimum clock duration.

19. An apparatus, comprising:
a memory array comprising an array of memory cells that each comprise capacitive storage elements; and
a circuit coupled with the memory array and configured to cause the apparatus to:

combine a first parameter with a second parameter to generate a third parameter, wherein the first parameter is associated with a duration for a clock that is coupled with the memory array to perform a clock cycle and the second parameter corresponds to a timing constraint associated with initiating an access operation for the memory array;

determine a latency of a column address strobe based at least in part on the third parameter satisfying a threshold value and on a data rate at which the memory array is operated satisfying a threshold data rate; and access one or more memory cells of the memory array based at least in part on the latency of the column address strobe.

20. The apparatus of claim 19, wherein the circuit is further configured to cause the apparatus to:

combine the first parameter with a fourth parameter to generate a fifth parameter, wherein the fourth parameter is associated with a second timing constraint associated with a row address strobe of the memory array, and wherein determining the latency of the column address strobe is based at least in part on combining the first parameter with the fourth parameter.

21. The apparatus of claim 20, wherein determining the latency of the column address strobe is based at least in part on the fourth parameter satisfying a second threshold value.

22. The apparatus of claim 20, wherein combining the first parameter with the second parameter is based at least in part on the fourth parameter failing to satisfy a second threshold value.

23. The apparatus of claim 19, wherein the circuit is further configured to cause the apparatus to:

combine the first parameter with a fourth parameter to generate a fifth parameter, wherein the fourth parameter corresponds to a second timing constraint associated with initiating the access operation for the memory array, and wherein determining the latency of the column address strobe is based at least in part on the fourth parameter failing to satisfy the threshold value.

24. The apparatus of claim 19, wherein the circuit is further configured to cause the apparatus to:

determine that the data rate satisfies the threshold data rate and is below a second threshold data rate that is higher than the threshold data rate, wherein determining the latency of the column address strobe is based at least in part on the data rate satisfying the threshold data rate and being below the second threshold data rate that is higher than the threshold data rate.

25. The apparatus of claim 19, wherein the circuit is further configured to cause the apparatus to:

determine that the data rate fails to satisfy a second threshold data rate, wherein combining the first parameter with the second parameter is based at least in part on the data rate failing to satisfy the second threshold data rate.

26. An apparatus comprising:

a memory array comprising an array of memory cells that each comprise capacitive storage elements; and a circuit coupled with the memory array and configured to cause the apparatus to:

combine a first parameter with a second parameter to generate a third parameter, wherein the first parameter is associated with a duration for a clock that is coupled with the memory array to perform a clock cycle and the second parameter is associated with a first timing constraint associated with initiating an access operation for the memory array;

combine the first parameter with a fourth parameter to generate a fifth parameter, wherein the fourth parameter is associated with a second timing constraint associated with a row address strobe of the memory array;

determine a latency of a column address strobe based at least in the third parameter satisfying a first threshold and the fifth parameter satisfying a second threshold; and access one or more memory cells of the memory array based at least in part on the latency of the column address strobe.

27. The apparatus of claim 26, wherein the circuit is further configured to cause the apparatus to:

combine the first parameter with a sixth parameter to generate a seventh parameter, wherein the sixth parameter is associated with a third timing constraint associated with initiating the access operation for the memory array, and wherein combining the first parameter with the second parameter is based at least in part on the sixth parameter failing to satisfy the first threshold.

28. The apparatus of claim 27, wherein the circuit is further configured to cause the apparatus to:

determine that the first timing constraint is associated with a first speed bin and the third timing constraint is associated with a second speed bin.

29. The apparatus of claim 28, wherein the third timing constraint is higher than the first timing constraint based at least in part on the first timing constraint being associated with the first speed bin and the third timing constraint being associated with the second speed bin.

30. The apparatus of claim 26, wherein the circuit is further configured to cause the apparatus to:

combine the first parameter with a sixth parameter to generate a seventh parameter, wherein the sixth parameter is associated with a third timing constraint associated with the row address strobe of the memory array, and wherein combining the first parameter with the fourth parameter is based at least in part on the sixth parameter failing to satisfy the second threshold.

31. The apparatus of claim 30, wherein the circuit is further configured to cause the apparatus to:

determine that the second timing constraint is associated with a first speed bin and the third timing constraint is associated with a second speed bin.

32. The apparatus of claim 31, wherein the third timing constraint is higher than the second timing constraint based at least in part on the second timing constraint being associated with the first speed bin and the third timing constraint being associated with the second speed bin.

* * * * *